United States Patent
Jiang et al.

(10) Patent No.: US 8,726,207 B2
(45) Date of Patent: May 13, 2014

(54) ON-THE-FLY DEVICE CHARACTERIZATION FROM LAYOUTS OF CIRCUITS

(75) Inventors: Yu-Sian Jiang, Kaohsiung (TW); Ya-Li Tai, Hsin-Chu (TW); Mu-Jen Huang, Taipei (TW); Chien-Wen Chen, Hsin-Chu (TW); Chauchin Su, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/115,752

(22) Filed: May 25, 2011

(65) Prior Publication Data
US 2012/0304146 A1    Nov. 29, 2012

(51) Int. Cl.
*G06F 17/50*    (2006.01)
(52) U.S. Cl.
USPC ........................................................ 716/110
(58) Field of Classification Search
USPC ................................. 716/100, 110
See application file for complete search history.

(56) References Cited

U.S. PATENT DOCUMENTS

| | | | |
|---|---|---|---|
| 6,550,050 B2* | 4/2003 | Hosono et al. | 716/113 |
| 6,862,723 B1* | 3/2005 | Wang et al. | 716/112 |
| 2005/0114819 A1* | 5/2005 | Goren et al. | 716/11 |
| 2005/0204318 A1* | 9/2005 | Iadanza et al. | 716/4 |
| 2005/0229142 A1* | 10/2005 | Boppana et al. | 716/17 |
| 2008/0127000 A1* | 5/2008 | Majumder et al. | 716/2 |
| 2009/0150848 A1* | 6/2009 | Alon et al. | 716/12 |
| 2009/0187866 A1* | 7/2009 | Ou et al. | 716/4 |
| 2009/0326873 A1* | 12/2009 | Wang et al. | 703/1 |
| 2011/0078649 A1 | 3/2011 | Ma | |
| 2012/0022846 A1* | 1/2012 | White et al. | 703/14 |
| 2012/0023467 A1* | 1/2012 | Mcsherry et al. | 716/112 |
| 2012/0053923 A1* | 3/2012 | Li et al. | 703/14 |
| 2013/0055184 A1* | 2/2013 | Shroff et al. | 716/112 |
| 2013/0326447 A1* | 12/2013 | Huang et al. | 716/112 |

* cited by examiner

*Primary Examiner* — Suchin Parihar
(74) *Attorney, Agent, or Firm* — Slater & Matsil, L.L.P.

(57) ABSTRACT

A design system includes a layout module and a user interface. The layout module includes a computing unit, which is configured to extract layout parameters of an integrated circuit device in a circuit during a layout stage of the circuit, and calculate circuit parameters of the device using the layout parameters. The user interface is configured to display the circuit parameters of the device in response to a user selection of the device.

16 Claims, 4 Drawing Sheets

ON-THE-FLY DEVICE CHARACTERIZATION FROM LAYOUTS OF CIRCUITS

BACKGROUND

In a typical integrated circuit design process, a circuit schematic of an integrated circuit being designed is generated first, for example, in a schematic editor. A pre-layout simulation is performed on the circuit schematic to simulate the performance of the integrated circuit. Since the layout of the integrated circuit has not been created yet at the time the pre-layout simulation is performed, the layout-dependent effects (LDEs) of the layout of the integrated circuit cannot be taken into the account of the pre-layout simulation. Instead, in the pre-layout simulation, default values of the LDEs are assumed.

Following the pre-layout simulation, the layout of the integrated circuit is generated, for example, using a layout editor. A design verification is then performed on the layout, wherein the design verification includes design rule check (DRC), layout versus schematic verification (LVS), layout parameter extraction (LPE), and parasitic extraction (RCX).

A post-layout simulation is then performed on the layout. In the post-layout simulation, the LDEs are taken into account, so that the generated circuit performance parameters reflect the actual circuit more accurately. The circuit performance parameters are then compared to the design specification. If the circuit performance parameters meet the requirement of the design specification, the design can be signed off. Otherwise, the design process loops back to the schematic generation and editing steps, and the steps including the pre-layout simulation, the layout creation, the design verification, and the post-layout simulation are repeated to modify the design. The loop is repeated until eventually the circuit performance parameters meet the requirement of the design specification.

In the convention design, there is a gap between the pre-layout simulation and the post-layout simulation. Since the pre-layout simulation does not accurately reflect the circuit performance, it becomes costly to realize that the circuit needs to be modified until post-layout simulation, at which time all of the layout of the integrated circuit have been finished.

In advanced nanometer CMOS design, LDEs exert stronger influence than in older generations of circuits on device characteristics, such as current capability for digital circuits, output impedance, and trans-conductance of analog circuits. Therefore, the gap between the pre-layout simulation and the post-layout simulation is severe enough to force designers to reserve extra design margin than before. The achievable speed performance is thus significantly sacrificed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A real-time device characterization method and a layout-dependent effect (LDE) aware layout module for achieving the same are provided in accordance with an embodiment. The variations and the operation of the embodiment are then discussed. Throughout the various views and illustrative embodiments, like reference numbers are used to designate like elements.

Figure 1:
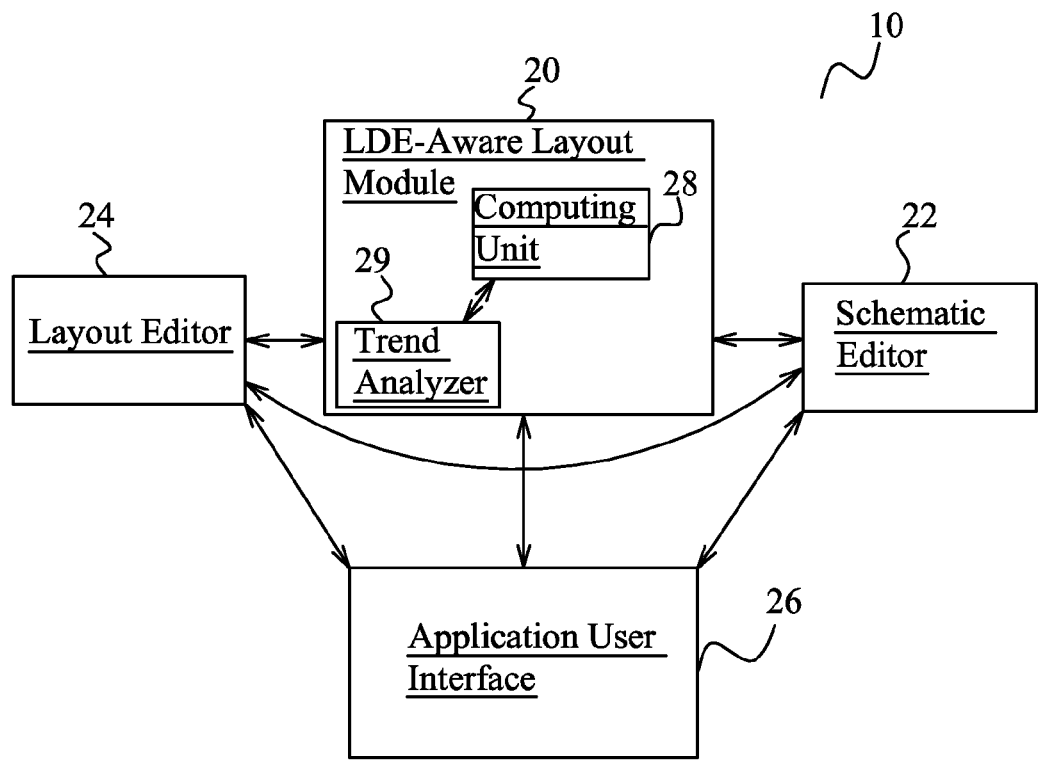
FIG. 1 illustrates a block diagram of a layout-dependent effect (LDE) aware layout module.
Figure 5:
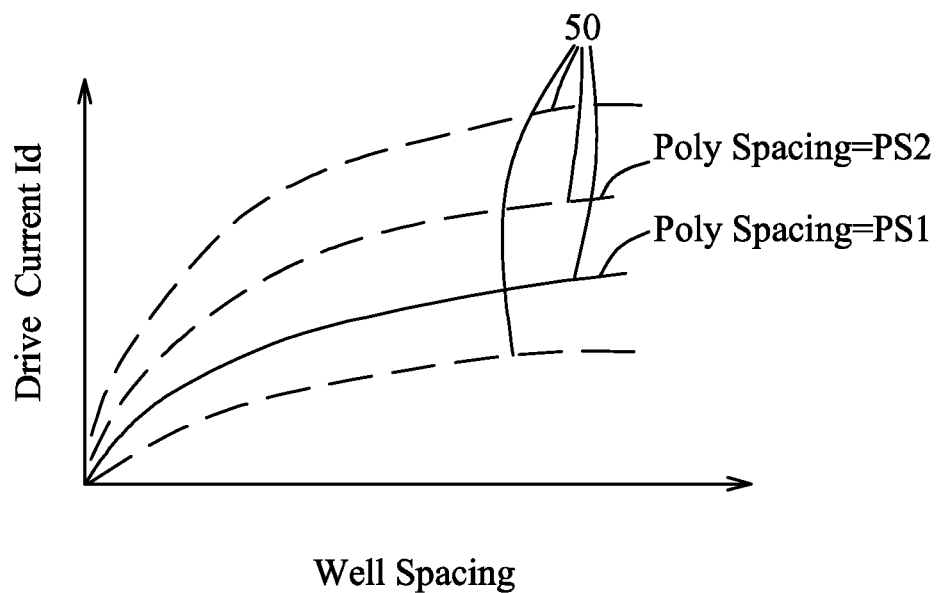
FIG. 5 illustrates a plot showing a trend of the change in an exemplary circuit parameter in response to the change in a layout parameter.

FIG. 1 illustrates a block diagram of layout system 10 for performing the layout of integrated circuits in accordance with embodiments. Layout system 10 includes LDE-aware layout module 20, schematic editor 22, layout editor 24, and an application user interface 26. Schematic editor 22 is configured to be used to generate and edit circuit schematics of integrated circuits that are being designed. Layout editor 24 is configured to be used to generate and edit layouts of the integrated circuits, which layouts are generated in accordance with the schematics. Application user interface 26 is configured to provide visual presentation (for example, by illustrating on screens) to users. In the visual presentation, the circuit schematics, the layouts, the respective LDE parameters extracted from the layouts (for example, through layout editor 24), and the calculated circuit parameters may be displayed. Application user interface 26 is also configured to receive user inputs to adjust the circuit schematics and the layouts, to select specific device such as a transistor in order to display its circuit parameters, and to plot the trend as shown in FIG. 5. The interaction between components 20, 22, 24, and 26 are schematically illustrated using arrows.

Figure 2:
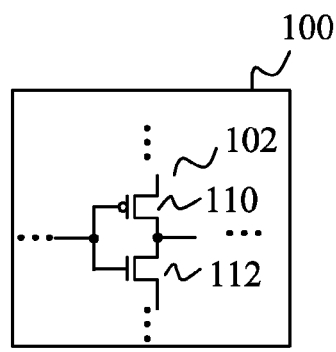
FIG. 2 illustrates an exemplary circuit, on which the LDE-aware layout is performed.

FIG. 2 schematically illustrates a schematic of circuit 100, which is being designed in accordance with embodiments. Circuit 100 includes inverter 102, which is used as an example to explain the concept of the embodiments. It is realized that the actual designed circuit may include much more devices than inverter 102. Inverter 102 includes PMOS transistor 110 and NMOS transistor 112, with the respective drain regions interconnected, and the gates interconnected.

Figure 4:
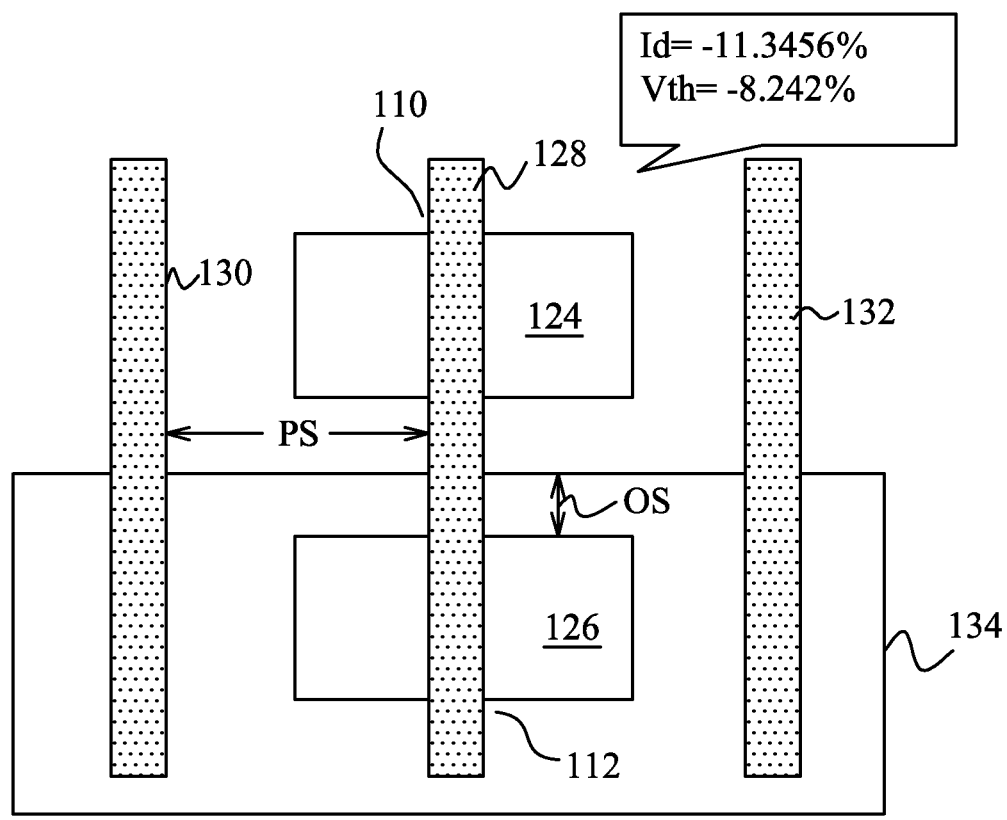
FIG. 4 illustrates a portion of a circuit that is being laid out, with the illustrated portion comprising a PMOS transistor and an NMOS transistor.

FIG. 4 schematically illustrates a part of the layout of PMOS transistor 110 and NMOS transistor 112. PMOS transistor 110 includes active region (OD) 124 and polysilicon gate 128 formed over OD 124. NMOS transistor 112 includes OD 126 and polysilicon gate 128 formed over OD 126. Dummy gate electrode (dummy poly) 130 and 132 are formed adjacent to PMOS transistor 110 and NMOS transistor 112. P-well region 134 is also illustrated, wherein OD 126 is a portion of p-well region 134.

Figure 3:
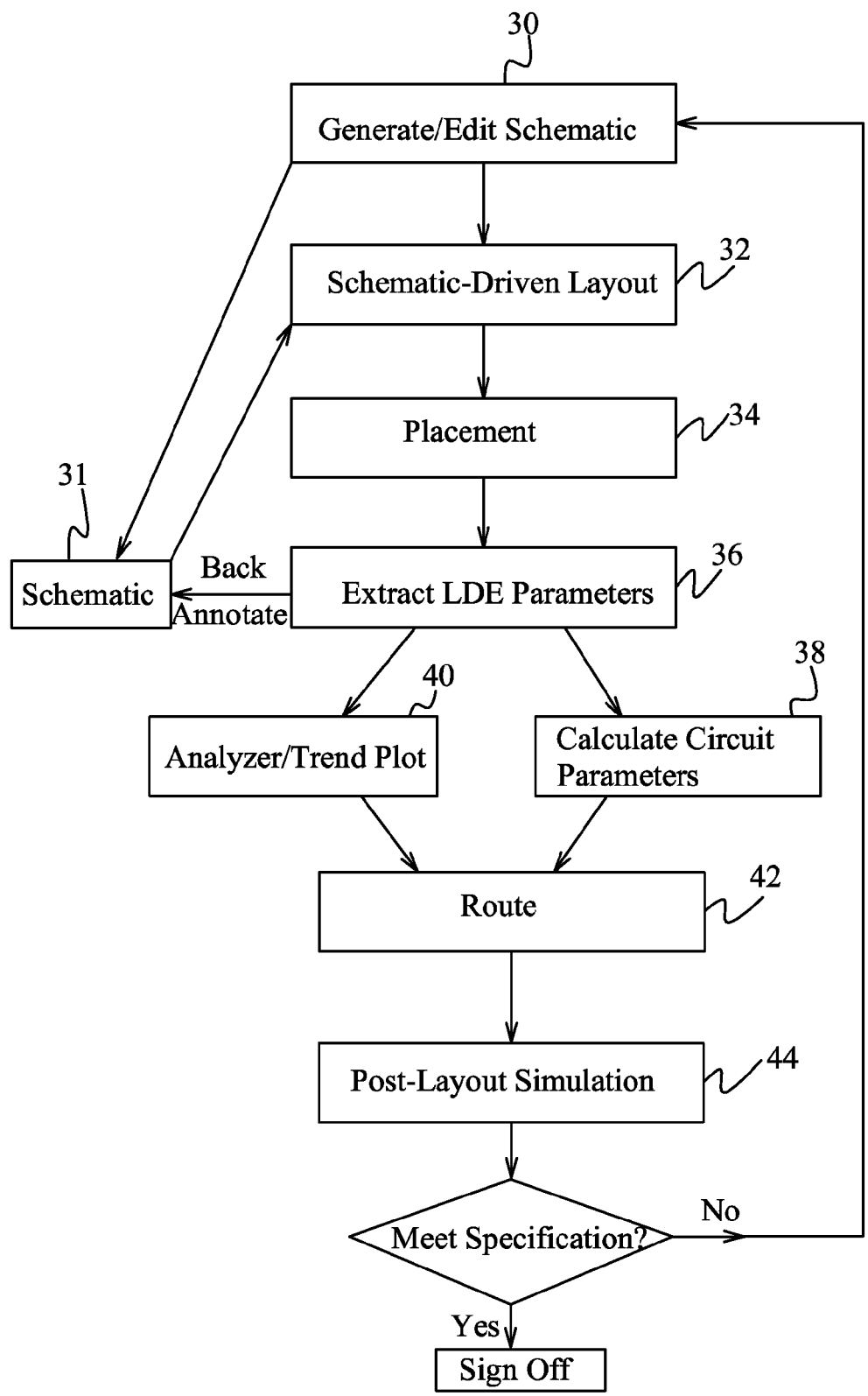
FIG. 3 illustrates a flow chart of an LDE-aware circuit design process.

FIG. 3 illustrates a schematic flow of an integrated circuit design process in accordance with embodiments. In step 30, circuit schematic 31 of the integrated circuit 100 that is being designed is generated and edited, for example, using schematic editor 22 as shown in FIG. 1. In step 32, a schematic-driven layout step is performed, wherein the devices such as transistors (including PMOS transistor 110 and NMOS transistor 112 in FIG. 2) in circuit schematic 31 are extracted from schematic 31, and the layouts of the individual extracted devices may be generated. In placement step 34, the layouts of the individual extracted devices are placed to desirable locations. Placement step 34 may be performed using layout editor 24 as shown in FIG. 1. In placement step 34, layout constraints are followed to ensure that design rules are not violated.

In step 36, layout parameters (alternatively referred to as LDE parameters hereinafter) are extracted from the layout generated in step 34. It is appreciated that at the time the LDE parameters are extracted, the layout of circuit 100 may not be finished yet, and there may be a portion laid out, while remaining portions have not been laid out yet. The LDE parameters include, and are not limited to, the parameters related to well proximity effect (WPE), OD-spacing effect (OSE), poly-spacing effect (PSE), length of diffusion (LOD) effect, boundary effect, and the like. For example, referring to FIG. 4, the LED parameters may include the poly-spacing PS, OD spacing OS, and the like. Other parameters such as length of diffusion, the distance between a poly gate and a boundary of a well region (such as well region 134 in FIG. 4), and other layout parameters related to the layout of transistors 110 and 112, are also extracted as LDE parameters.

Referring back to FIG. 3, in step 38, the circuit (performance) parameters of the devices in integrated circuit 100 (FIG. 2) are calculated. Step 38 may be performed by computing unit 28 in LDE-aware layout module 20 (FIG. 1). For example, drive currents Id, threshold voltage Vth, trans-conductance Gm, drain conductance Gds, and the like of each of transistors 110 and 112 as in FIG. 2 may be calculated. Since at this step, transistors 110 and 112 have been laid out, and at least some of the neighboring environments such as the neighboring polysilicon gates 130 and 132, the neighboring well regions (not shown), and the like have also been laid out, the related LDE parameters may be extracted from the existing layout. The extracted LDE parameters are taken into account of the calculation of the circuit parameters. This step is referred to as the back-annotating of the LDE parameters to schematic, wherein the default assumed layout parameters in schematic 31 are now replaced with the actual extracted LDE parameters. In an embodiment, the extraction (step 36) of the LDE parameters is also performed by computing unit 28 in FIG. 1, which is a portion of LDE-aware layout module 20. Extraction step 36 and calculation step 38 may be performed as a background computation process performed simultaneously with the proceeding of the layout step 34, which means that when a transistor such as 110/112 (FIG. 2) is laid out, extraction step 36 and calculation step 38 may be performed on the layout without waiting for the layout of the entire circuit 100 in FIG. 2 to finish.

The calculated circuit performance may be displayed for designers to view, for example, through application user interface 26 (FIG. 1). FIG. 4 shows exemplary displayed circuit performance parameters of PMOS transistor 110, which circuit parameters are displayed when the designer selects PMOS transistor 110, and requests its circuit parameters to be shown. A hotkey (of the computer used by the designers) may be designated for application user interface 26, so that the circuit performance parameters of the selected devices (such as transistors) may be displayed in response to the selection of transistor 110 and the pressing of the hotkey. Since user may be able to display the circuit parameters of device in circuit 100 anytime after the device is laid out, the visualization of the circuit performance parameters are also referred to as on-the-fly visualization, which may be essentially a real-time visualization process.

In an embodiment, as shown in FIG. 4, the circuit performance parameters are displayed as degradation values, which represent the degradation of the calculated values compared to the simulation results obtained without having the extracted LDE parameters annotated to circuit schematic 31. In the simulation results without taking the actual layout effect into account, default LDE parameters are assumed. With the extracted LDE parameters taken into account, the resulting circuit performance parameters are likely to degrade compared to if the default LDE effects are used. Accordingly, in an embodiment, the circuit performance parameters are displayed as the degradation percentage values, although the actual calculated values of the circuit performance parameters may also be displayed. In the example shown in FIG. 4, the drive current Id of PMOS transistor 110 is degraded by about 11.3 percent, while the threshold voltage is degraded by about 8.2 percent.

The displayed circuit parameters as calculated in step 38 reflect the performance of the existing layout. For designers to better predict how to adjust the circuit layout, trend analyzer 29 (FIG. 1) is incorporated in LDE-aware layout module 20 to perform trend analysis. Although trend analyzer 29 and computing unit 28 are shown as separate components, trend analyzer 29 may also be a part of computing unit 28. The respective step is shown as step 40 in FIG. 3. For example, FIG. 5 illustrates an exemplary trend plot generated by trend analyzer 29, and displayed for user review. The trend schematically illustrates how drive current Id changes with the increase and the decrease of well spacing, which may be measured from the gate of a transistor to a neighboring well region. Furthermore, trend analyzer 29 may accept different user-entered layout parameters, and show the trend of circuit performance parameters with the user-entered layout parameters incorporated in the calculation. For example, the user may enter poly spacing with a first value PS1, and trend analyzer 29 in accordance generates a first trend with drive current Id (with the poly spacing equal to PS1) shown as a function of the well spacing. User may enter poly spacing with a second value PS2 different from value PS1, and trend analyzer 29 in accordance generates a second trend with drive current Id (with the poly spacing equal to PS2) shown as a function of the well spacing. The trend plot may also show a plurality of lines 50 in a same figure, with each of the lines 50 corresponding to a value of one of the layout parameters (such as poly spacing).

Steps 36, 38, and 40 as in FIG. 3 may be performed by LDE-aware layout module 20 in FIG. 1. Steps 36, 38, and 40 may be performed any time after the layout steps 32 and 34 are started, and may be performed any time before or after the finish of the layout of integrated circuit 100 (FIG. 2). For example, steps 36, 38, and 40 may be performed when only several transistors in a circuit are laid out, one or more functional unit of the circuit is laid out, or after an entire circuit 100 is laid out. Furthermore, steps 36, 38, and 40 may be performed between or after the routing step (step 42 in FIG. 3) of the circuit is performed.

After the layout of the circuit, routing step 42 may be performed to layout metal lines used for interconnecting the devices in the integrated circuit. In some embodiments, the routing step includes the routing of polysilicon lines as interconnection lines. Accordingly, the LDE effects also include the effect of the polysilicon lines. Similarly, the on-the-fly visualization of circuit performance may be done before and/or after some or all of the polysilicon lines and metal lines are routed, and hence the layout may be adjusted, if needed, to accommodate the effect of the polysilicon lines.

Referring again to FIG. 3, post-layout simulation 44 may be performed to generate a full-fledged evaluation result of the layout. After the post-layout simulation is performed, the circuit performance parameters of the entire circuit 100 are generated, and are compared to the requirements of the design specification. The design process may loop back to step 30 to modify the design in the case the circuit performance parameters do not meet the requirements of the design specification. Otherwise, if circuit performance parameters meet the requirements of the design specification, the circuit and the layout may be signed off, and the design is finished.

With the ability of checking the circuit performance of the devices in real time, the designers can adjust a circuit at the time the circuit is laid out, and there is no need to wait until after the post-layout simulation. As shown in FIGS. 4 and 5, since the circuit performance parameters of the devices may be known as soon as the devices are laid out, designers may be able to determine whether the devices meet design specification or not, and may be able to adjust the layout accordingly in real-time. For example, if drive current Id of a transistor does not meet the design specification, then the poly spacing, the well spacing, and the like related to the transistor may be adjusted to increase drive current Id. Conversely, if drive current Id of a transistor exceeds the design specification with more margin than desirable, the adjustment to the layout such as the poly spacing, the well spacing, and the like may be performed to reduce the margin and to reduce the chip area usage of the transistor. Therefore, by using the embodiment, it is possible to compromise between the performance of the circuit and the chip area usage. Furthermore, designers may be able to evaluate between alternative layout schemes to choose the optimized ones.

In accordance with embodiments, a design system includes a layout module and a user interface. The layout module includes a computing unit, which is configured to extract layout parameters of an integrated circuit device in a circuit during a layout stage of the circuit, and calculate circuit parameters of the device using the layout parameters. The user interface is configured to display the circuit parameters of the device in response to a user selection of the device.

In accordance with some embodiments, a design system includes a layout module and a user interface. The layout module includes a computing unit, which is configured to extract layout parameters of an integrated circuit device in a circuit during a layout stage of the circuit, and calculate circuit parameters of the device using the layout parameters. The user interface is configured to display the circuit parameters of the device in response to a user selection of the device.

In accordance with other embodiments, a layout module is configured to extract layout parameters of a transistor of a circuit, and back annotate the layout parameters to a schematic of the circuit to replace default layout parameters. The default layout parameters are assumed values. The layout module is further configured to calculate circuit parameters of the transistor using the schematic having the layout parameters.

In accordance with yet other embodiments, a method includes laying out a portion of a circuit as a layout according to a schematic of the circuit, and extracting layout parameters of a transistor in the circuit from the layout. The layout parameters are back annotated to the schematic to replace default layout parameters of the transistor, wherein the default layout parameters are assumed values. The circuit parameters of the transistor are calculated using the schematic comprising the layout parameters extracted from the layout. The circuit parameters of the transistor may be displayed on a user interface.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A design system comprising:
   a layout module comprising a computing unit, wherein the computing unit is configured to:
      extract layout parameters of an integrated circuit device in a circuit during a layout stage of the circuit; and
      calculate circuit parameters of the device using the layout parameters, wherein the computing unit is configured to perform a background computation to extract the layout parameters and to calculate the circuit parameters before the layout stage of the circuit is finished, and wherein the computing unit is configured to extract the layout parameters and to calculate the circuit parameters before metal lines interconnecting devices in the circuit are routed; and
   a user interface configured to display the circuit parameters of the device in response to a user selection of the device.

2. The design system of claim 1, wherein the integrated circuit device is a transistor, wherein the circuit parameters comprise a parameter selected from the group consisting essentially of a drive current, a threshold voltage, a transconductance, and a drain conductance of the transistor, and wherein the layout parameters comprise a parameter selected from the group consisting essentially of a well proximity parameter, an OD spacing, a poly-spacing, a length of diffusion, and combinations thereof, of the transistor.

3. The design system of claim 1 further comprising a schematic editor configured to be used to edit a schematic of the circuit, and wherein the schematic editor is configured to have the layout parameters back annotated to the schematic to replace default assumed layout parameters of the integrated circuit device.

4. The design system of claim 1 further comprising a layout editor, wherein the layout module is configured to be used to extract the layout parameters of the integrated circuit device.

5. The design system of claim 1, wherein the layout module further comprises an analyzer configured to generate and plot a trend of a degradation of the circuit parameters in response to changes of the layout parameters.

6. The design system of claim 1, wherein the layout module and the user interface are configured to display the circuit parameters as degradation percentages.

7. A design system comprising:
   a layout module embodied on a non-transitory computer-readable medium, the layout module, when executed by a computer, is configured to:

extract layout parameters of a transistor of a circuit, wherein the layout parameters comprise a parameter selected from the group consisting essentially of a well proximity parameter, an OD spacing, a poly-spacing, a length of diffusion, and combinations thereof, of the transistor;

back annotate the layout parameters to a schematic of the circuit to replace default layout parameters, wherein the default layout parameters are assumed values; and calculate circuit parameters of the transistor using the schematic comprising the layout parameters, wherein the circuit parameters comprise a parameter selected from the group consisting essentially of a drive current, a threshold voltage, a trans-conductance, and a drain conductance of the transistor.

8. The design system of claim 7 further comprising a user interface configured to display the circuit parameters of the transistor in response to a user selection of the transistor.

9. The design system of claim 8, wherein the circuit parameters are displayed as degradation values degraded from circuit parameters simulated from the schematic having the default layout parameters.

10. The design system of claim 7 further comprising:

a schematic editor configured to be used to edit the schematic of the circuit, wherein the schematic editor and the layout module are configured to have the layout parameters back annotated to the schematic; and a layout editor configured to be used to generate and edit a layout of the circuit, wherein the layout module is configured to extract the layout parameters of the transistor from the layout.

11. The design system of claim 7, wherein the layout module further comprises an analyzer configured to generate and plot a trend of a degradation of one of the circuit parameters in response to a change of the one of the layout parameters.

12. A method comprising:

laying out a portion of a circuit as a layout according to a schematic of the circuit;

extracting layout parameters of a transistor in the circuit from the layout;

back annotating the layout parameters to the schematic to replace default layout parameters of the transistor, wherein the default layout parameters are assumed values;

calculating by a computer circuit parameters of the transistor using the schematic comprising the layout parameters extracted from the layout; and displaying the circuit parameters of the transistor on a user interface in response to a user selection of the transistor.

13. The method of claim 12 further comprising:

routing metal lines to interconnect devices in the layout; and performing a post-layout simulation to simulate performance of an entirety of the circuit, wherein the steps of extracting, back annotating, and calculating are performed before the step of routing and the post-layout simulation.

14. The method of claim 12 further comprising calculating and plotting a trend of a degradation of one of the circuit parameters in response to a change of the one of the layout parameters.

15. The method of claim 12, wherein the circuit parameters comprise a parameter selected from the group consisting essentially of a drive current, a threshold voltage, a trans-conductance, and a drain conductance of the transistor, and wherein the layout parameters comprise a parameter selected from the group consisting essentially of a well proximity parameter, an OD spacing, a poly-spacing, a length of diffusion, and combinations thereof, of the transistor.

16. The method of claim 12, wherein the circuit parameters of the transistor are displayed on the user interface as degradation percentages, and wherein the degradation percentages are degraded from circuit parameters calculated from the schematic of the circuit having the default layout parameters.

* * * * *